(12) United States Patent
Liu et al.

(10) Patent No.: US 8,723,322 B2
(45) Date of Patent: May 13, 2014

(54) METHOD OF METAL SPUTTERING FOR INTEGRATED CIRCUIT METAL ROUTING

(75) Inventors: Hsien-Tsung Liu, Hsin-Chu (TW); Chien-Kang Chou, Tainan (TW); Ching-San Lin, Taichung (TW)

(73) Assignee: Megit Acquisition Corp., San Diego, CA (US)

( * ) Notice: Subject to any disclaimer, the term of this patent is extended or adjusted under 35 U.S.C. 154(b) by 1817 days.

(21) Appl. No.: 11/364,375

(22) Filed: Feb. 28, 2006

(65) Prior Publication Data

US 2006/0148247 A1    Jul. 6, 2006

Related U.S. Application Data

(63) Continuation of application No. 10/954,781, filed on Sep. 30, 2004, now abandoned, which is a continuation of application No. 10/336,871, filed on Jan. 6, 2003, now Pat. No. 6,802,945.

(51) Int. Cl.
*H01L 23/48* (2006.01)

(52) U.S. Cl.
USPC ........... 257/763; 257/734; 257/737; 257/741; 257/750; 257/751; 257/757; 257/784

(58) Field of Classification Search
USPC ......... 257/499, 626, 734, 737, 784, 741, 750, 257/751, 757, 763; 438/687
See application file for complete search history.

(56) References Cited

U.S. PATENT DOCUMENTS 4,704,301 A    11/1987    Bauer et al.
5,046,161 A     9/1991    Takada (Continued)

FOREIGN PATENT DOCUMENTS

EP    0273715    7/1994
TW    406304     9/2000

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Rodney McDonald
(74) *Attorney, Agent, or Firm* — Seyfarth Shaw LLP

(57) ABSTRACT

A method of metal sputtering, comprising the following steps. A wafer holder and inner walls of a chamber are coated with a seasoning layer comprised of: a) a material etchable in a metal barrier layer etch process; or b) an insulating or non-conductive material. A wafer having two or more wafer conductive structures is placed upon the seasoning layer coated wafer holder. The wafer is cleaned wherein a portion of the seasoning layer is re-deposited upon the wafer over and between adjacent wafer conductive structures. A metal barrier layer is formed over the wafer. The wafer is removed from the chamber and at least two adjacent upper metal structures are formed over at least one portion of the metal barrier layer. The portions of the metal barrier layer not under the at least two adjacent upper metal structures are etched and removed from over the wafer exposing portions of the re-deposited seasoning layer portions using the metal barrier layer etch process which also removes any exposed portions of the re-deposited seasoning layer portions that are comprised of a material etchable in the metal barrier layer etch process.

27 Claims, 3 Drawing Sheets

(56) References Cited

U.S. PATENT DOCUMENTS

| | | | |
|---|---|---|---|
| 5,061,985 A | | 10/1991 | Meguro et al. |
| 5,244,833 A | | 9/1993 | Gansauge et al. |
| 5,767,010 A | * | 6/1998 | Mis et al. .................... 438/614 |
| 5,933,758 A | * | 8/1999 | Jain .............................. 438/687 |
| 6,075,290 A | | 6/2000 | Schaefer et al. |
| 6,080,529 A | | 6/2000 | Ye et al. |
| 6,267,852 B1 | | 7/2001 | Givens et al. |
| 6,274,058 B1 | | 8/2001 | Rajagopalan et al. |
| 6,281,116 B1 | | 8/2001 | Yanagida |
| 6,309,967 B1 | | 10/2001 | Honeycutt et al. |
| 6,319,842 B1 | | 11/2001 | Khosla et al. |
| 6,340,405 B2 | | 1/2002 | Park |
| 6,518,092 B2 | | 2/2003 | Kikuchi |
| 6,566,270 B1 | | 5/2003 | Liu et al. |
| 6,578,754 B1 | | 6/2003 | Tung |
| 6,646,347 B2 | * | 11/2003 | Mercado et al. ............. 257/751 |
| 6,683,380 B2 | | 1/2004 | Efland et al. |
| 6,802,945 B2 | | 10/2004 | Liu et al. |
| 2002/0089062 A1 | * | 7/2002 | Saran et al. ................... 257/759 |
| 2005/0040033 A1 | | 2/2005 | Liu et al. |

FOREIGN PATENT DOCUMENTS

| | | |
|---|---|---|
| TW | 410431 | 11/2000 |
| TW | 410433 | 11/2000 |
| TW | 478649 | 3/2002 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

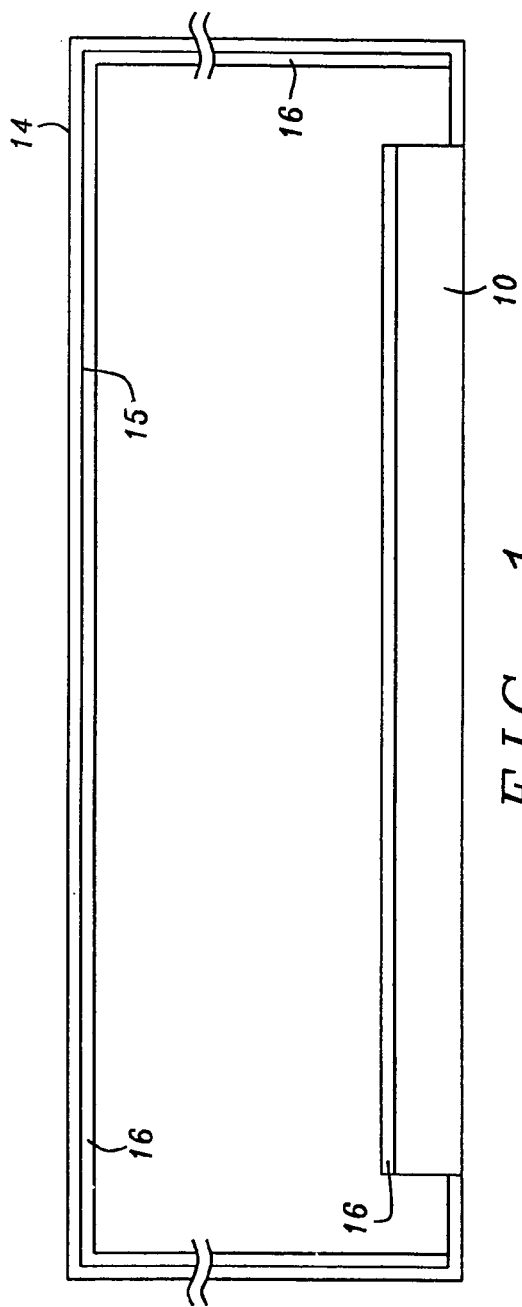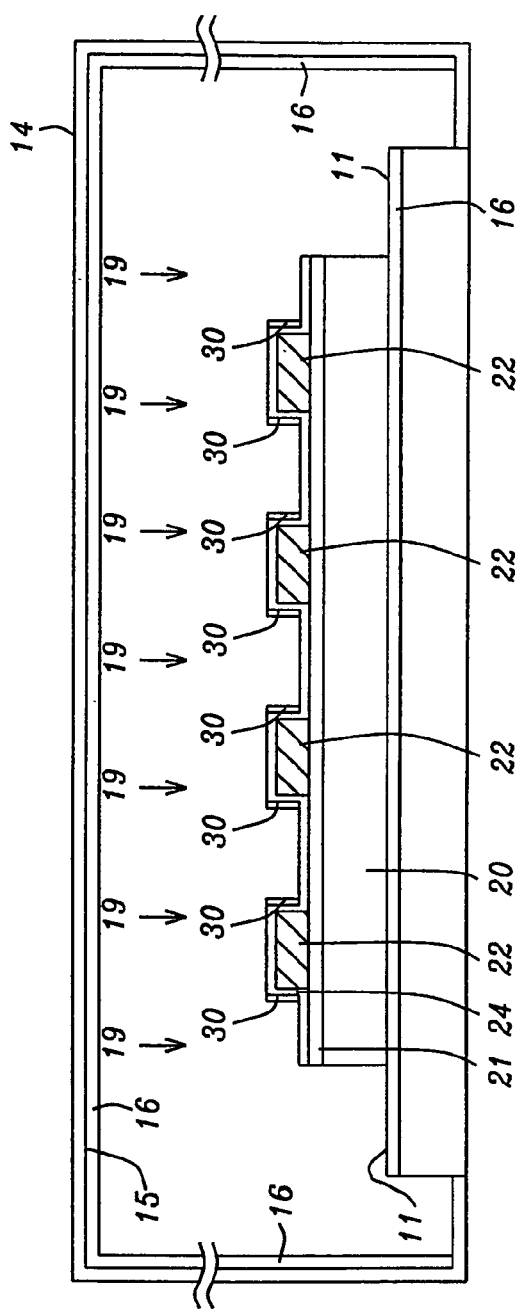

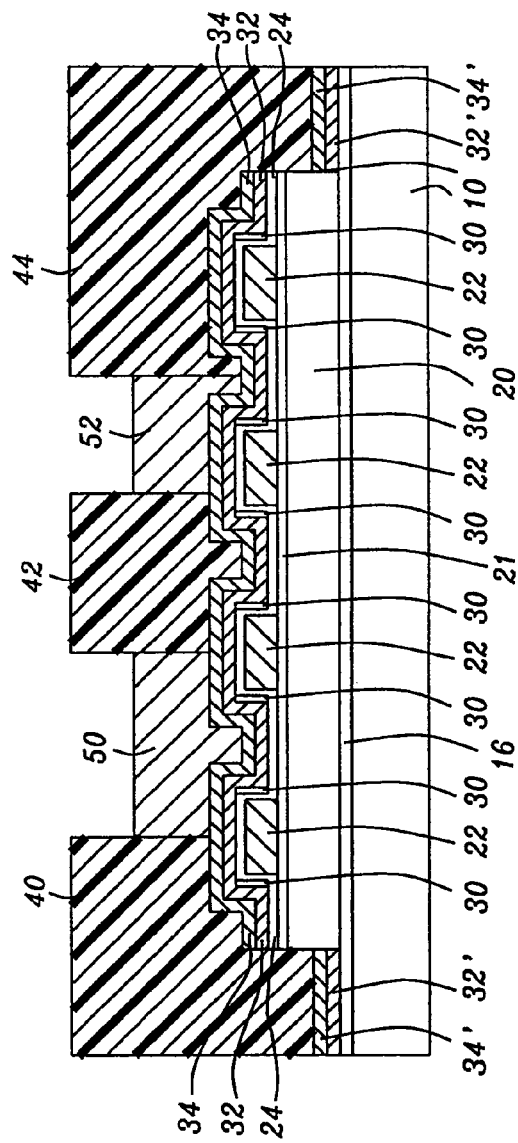
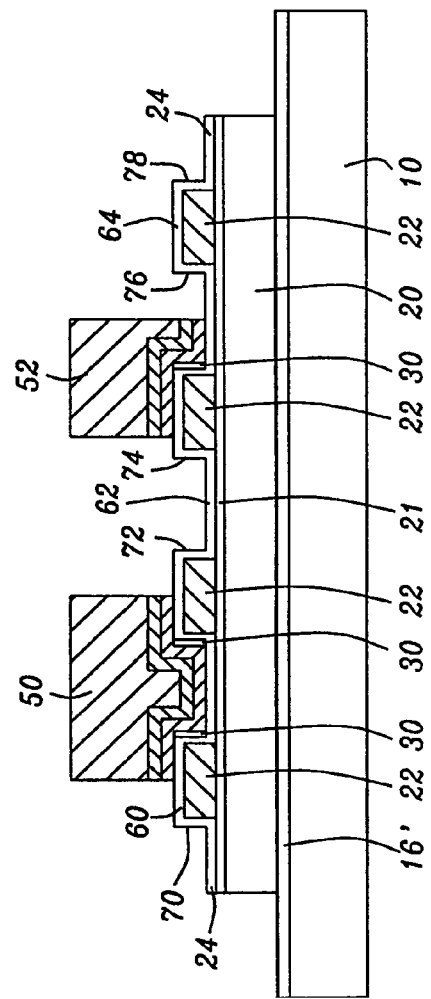

METHOD OF METAL SPUTTERING FOR INTEGRATED CIRCUIT METAL ROUTING

This application is a continuation of U.S. patent application Ser. No. 10/954,781, filed on Sep. 30, 2004, now abandoned, which is a continuation of U.S. patent application Ser. No. 10/336,871, filed on Jan. 6, 2003, now U.S. Pat. No. 6,802,945. A Method of Metal Sputtering For Integrated Circuit Metal Routing, assigned to the same assignee as the present invention, which is herein incorporated by reference in its entirety.

FIELD OF THE INVENTION

The present invention relates generally to fabrication of semiconductor devices, and more specifically to methods of sputtering metal onto structures.

BACKGROUND OF THE INVENTION

Electrical isolation between two conductive structures, such as metal lines or metal bumps, will not be good in current integrated circuit (IC) without planarization. The electrical isolation problem is caused by re-deposition of conductive material/metal from the wafer holder during pre-sputter cleaning forming stringers between adjacent metal conductive structures causing electrical shorting between the structures.

U.S. Pat. No. 4,704,301 to Bauer et al. describes a metal (e.g. aluminum) coater wafer holder.

U.S. Pat. No. 6,267,852 B1 to Givens et al. describes a wafer holder in a sputter clean tool and method.

U.S. Pat. No. 6,340,405 B1 to Park describes a wafer holder in an etch tool.

SUMMARY OF THE INVENTION

Accordingly, it is an object of the present invention to provide improved methods of reducing electrical shorting between adjacent conductive structures formed with a pre-sputtering cleaning step.

Other objects will appear hereinafter.

It has now been discovered that the above and other objects of the present invention may be accomplished in the following manner. Specifically, a wafer holder within a chamber is provided with the chamber having inner walls. The wafer holder and the inner walls of the chamber are coated with a seasoning layer. The seasoning layer being comprised of: a) a material etchable in a metal barrier layer etch process; or b) an insulating or non-conductive material. A wafer is placed upon the seasoning layer coated wafer holder. The wafer including two or more wafer conductive structures thereover. The wafer is cleaned wherein a portion of the seasoning layer is re-deposited upon the wafer over and between adjacent wafer conductive structures. A metal barrier layer is formed over at least over the wafer and the wafer conductive structures. The wafer is removed from the chamber. A patterned masking layer is formed over the metal barrier layer, leaving first exposed portions of the metal barrier layer. Using the patterned masking layer as masks, at least two adjacent upper metal structures are formed over the first exposed portions of the metal barrier layer. The patterned masking layer is removed, exposing second exposed portions of the metal barrier layer adjacent the at least two adjacent upper metal structures. The second exposed portions of the metal barrier layer are etched and removed from over the wafer exposing portions of the re-deposited seasoning layer portions using the metal barrier layer etch process. The metal barrier layer etch process also etching and removing the exposed portions of the re-deposited seasoning layer portions that are comprised of a material etchable in the metal barrier layer etch process.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which:

FIGS. 1 to 5 schematically illustrate in cross-sectional representation a preferred embodiment of the present invention.

DETAILED DESCRIPTION OF THE PREFERRED EMBODIMENTS

Initial Structure—FIG. 1

Figure 3:
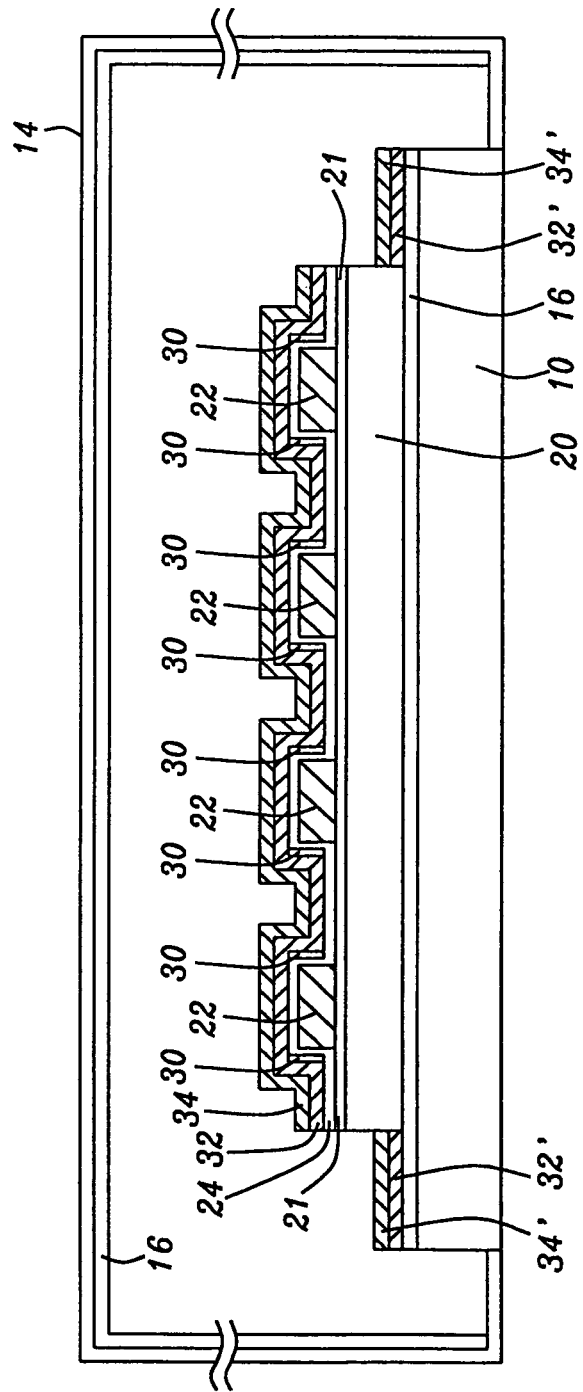

FIG. 1 is a schematic illustration show in a wafer holder 10 within a chamber 14. The wafer holder is preferably comprised of chromium (Cr), iron (Fe), nickel (Ni), manganese (Mn) or molybdenum (Mo) and is more preferably comprised of Cr, Fe or Ni.

In an important step of the invention, the wafer holder 10 (and/or other tools with the chamber 14) and inner chamber walls 15 are coated, or seasoned, with a seasoning layer 16 that is preferably comprised of: (1) a material that is etchable or removable during the metal barrier layer 32 (see below); or (2) an insulating or non-conducting dielectric material. The etchable-material seasoning layer 16 is preferably comprised of TiW or Ti. The insulating material seasoning layer 16 is preferably comprised of silicon oxide, silicon nitride or alumina and is more preferably comprised of silicon oxide.

Seasoning layer 16 preferably has a thickness of: (1) from about 500 to 50,000 Å and more preferably from about 1000 to 10,000 Å when comprised of an etchable-material; and (2) from about 500 to 10,000 Å and more preferably from about 500 to 3000 Å when comprised of an insulating material.

Placement of Wafer 20 onto Seasoned Wafer Holder 10—FIG. 2

As shown in FIG. 2, a wafer 20 is affixed to the seasoned wafer holder 10. Wafer 20 may be a semiconductor wafer including a semiconductor structure or substrate and active devices therein. Wafer 20 includes adjacent conductive structures 22 thereover with an uppermost intermetal dielectric layer 24 formed over the conductive structures 22. Conductive structures 22 may be comprised of metal, for example, and may be bumps comprised of gold, for example, solder bumps, interconnects comprised of copper, for example, or metal pads.

When the method of the present invention is used for post passivation technology the conductive structures 22 are formed above a wafer 20 passivation layer 21. The passivation layer 21 has a thickness of preferably from about 7000 to 20,000 Å and more preferably from about 10,000 to 15,000 Å and is preferably comprised of silicon oxide, silicon nitride or a composite of silicon oxide and silicon nitride and is more preferably a composite of silicon oxide and silicon nitride.

After placement of the wafer 20 onto the wafer holder 10, portions 11 of the seasoning layer 16 overlying the wafer holder 10 are left exposed.

Pre-Sputter Clean 19—FIG. 2

As shown in FIG. 2, a pre-sputter clean 19 is then performed on the wafer 20. The pre-sputter clean 19 is preferably an argon (Ar+) sputter process and causes re-deposition of some of the seasoning layer 16 from the exposed portions 11 of the seasoning layer 16 onto the intermetal dielectric layer 24 to form intermetal dielectric layer/passivation layer re-deposition portions 30. As shown the re-deposition portions 30 may include stringer portions between adjacent conductive structures.

Formation of Barrier Metal Layer 32 and Seed Metal Layer 34—FIG. 3

As shown in FIG. 3, a barrier metal layer 32 is formed over the intermetal dielectric layer 24 and re-deposited portions 30 over wafer 20. Barrier metal layer portions 32' may be also formed over the exposed portions 11 of the seasoning layer 16 over the wafer holder 10. Barrier metal layer 32/barrier metal layer portions 32' are preferably comprised of TiW or Ti and has a thickness of preferably from about 50 to 5000 Å and more preferably from about 100 to 3000 Å.

A seed metal layer 34 is then formed over the barrier metal layer 32 and seed metal layer portions 34' may be formed over the barrier metal layer portions 32. Seed metal layer 34/seed metal layer portions 34' are preferably comprised of copper (Cu) or gold (Au) and has a thickness of preferably from about 500 to 8000 Å and more preferably from about 800 to 6000 Å.

Formation of Upper Metal Structures 50, 52

As shown in FIG. 4, wafer 20 is removed from the chamber 14 and patterned mask layer portions 40, 42, 44 may be formed over the structure of FIG. 3 leaving selected portions of the seed metal layer 34 exposed. Patterned mask layer portions 40, 42, 44 are preferably comprised of photoresist.

Then, using the patterned mask layer portions 40, 42, 44 as masks, upper metal structures 50, 52 are then formed over the exposed portions of the seed metal layer 34, preferably using an electroplating process. Upper metal structures 50, 52 are preferably comprised of Cu, Ni, Au, Au/TiW, Cu/Ti, Ni/Cu/Ti, Cu/Cr or Ni/Cu Cr.

Upper metal structures 50, 52 are preferably spaced apart from about 1 µm to 1 mm.

As shown in FIG. 4, one 50 or more of the upper metal structure 50, 52 may serve to electrically connect adjacent conductive structures 22 and one 52 or more of the upper metal structure 50, 52 may serve to electrically connect to a single conductive structure 22.

Removal of Patterned Mask Layer Portions 40, 42, 44 and the Exposed and then Exposed Portions of Seed Metal Layer 34, 34' and Barrier Metal Layer 32, 32'

As shown in FIG. 5, the patterned mask layer portions 40, 42, 44 are removed to exposed portions of the seed metal layer 34 formerly thereunder.

The now exposed portions of the seed metal layer 34 over the wafer 20 are etched away as are the portions of the barrier metal layer 32 thereunder to expose portions 60, 62, 64 of the intermetal dielectric layer 24.

It is noted that the upper metal structures 50, 52 are much thicker than the seed metal layer 34 and so are not completely etched away during the etching of the seed metal layer 34. The thicknesses of the upper metal structures 50, 52 can be maintained by controlling the etching time.

It is noted that if the seasoning layer 16 of the present invention was selected to be etchable in the barrier metal layer 32 etch, the re-deposited portions 30 underlying the removed portions of the barrier metal layer 32 are also etched and removed as are any stringers of the re-deposited portions 30 as shown in FIG. 5. Thus, there will be no electrical shorts between adjacent upper metal structures 50, 52.

In the alternative, if the seasoning layer 16 was selected to be comprised of an insulating or non-conducting dielectric material, any re-deposited portions 30/stringers remaining that are under the removed portions of the seed metal layer 34 and barrier metal layer portions 32 over the wafer will not conduct electricity and therefore there will be no electrical shorts between adjacent upper metal structures 50, 52.

Further processing may then proceed.

If the upper metal structures 50, 52 are bumps comprised of gold, then the seasoning layer 16 is preferably comprised of TiW. If the upper metal structures 50, 52 are solder bumps, then the seasoning layer 16 is preferably comprised of Ti. If the upper metal structures 50, 52 are metal interconnects comprised of copper, then the seasoning layer 16 is preferably comprised of Ti.

The method of the present invention is admirably suited for use in bump-on-active (BOA) or pad-on-active (POA) applications.

ADVANTAGES OF THE INVENTION

The advantages of one or more embodiments of the present invention include lower manufacturing cost for post passivation metal routing.

While particular embodiments of the present invention have been illustrated and described, it is not intended to limit the invention, except as defined by the following claims.

We claim:

1. An integrated circuit comprising:
    a semiconductor substrate;
    an active device having a portion in said semiconductor substrate;
    a passivation layer on said semiconductor substrate, wherein said passivation layer comprises a nitride;
    a first conductive interconnect on said passivation layer;
    a second conductive interconnect on said passivation layer;
    a dielectric layer on said passivation layer, on a first surface and at least one sidewall of said first conductive interconnect, and on a first surface and at least one sidewall of said second conductive interconnect;
    a re-deposited seasoning layer on at least one sidewall of said dielectric layer;
    a titanium-containing layer on said dielectric layer and aligned with said first surfaces of said first and second conductive interconnects, said titanium-containing layer on the re-deposited seasoning layer, in which the re-deposited seasoning layer is surrounded by portions of the dielectric layer and said titanium-containing layer;
    a conductive seed layer on said titanium containing layer and aligned with said first surfaces of said first and second conductive interconnects; and
    a third conductive interconnect on said conductive seed layer and aligned with said first surfaces of said first and second conductive interconnects.

2. The integrated circuit of claim 1, wherein said titanium-containing layer comprises a titanium-tungsten alloy.

3. The integrated circuit of claim 1, wherein said nitride comprises silicon nitride.

4. The integrated circuit of claim 1, wherein said passivation layer has a thickness between 7,000 and 20,000 Angstroms.

5. The integrated circuit of claim 1, wherein said conductive seed layer has a thickness between 500 and 8,000 Angstroms.

6. The integrated circuit of claim 1, wherein said titanium-containing layer has a thickness between 50 and 5,000 Angstroms.

7. The integrated circuit of claim 1, wherein said first conductive interconnect is connected to said second conductive interconnect through said third conductive interconnect.

8. The integrated circuit of claim 1, wherein said third conductive interconnect further comprises nickel.

9. An integrated circuit comprising:
a semiconductor substrate;
an active device having a portion in said semiconductor substrate;
an insulating layer on said semiconductor substrate;
a first conductive interconnect on said insulating layer;
a dielectric layer on said insulating layer, on a first surface of said first conductive interconnect and on at least one sidewall of said first conductive interconnect, wherein said dielectric layer comprises a first portion, with a first dielectric surface, directly on said first surface of said first conductive interconnect, and a second portion, with a second dielectric surface, directly on said insulating layer but not over said first surface of said first conductive interconnect, wherein said second dielectric surface of said second portion is at a first level lower than a second level, in which said first dielectric surface of said first portion is positioned, and lower than a third level, at which said first surface of said first conductive interconnect is positioned;
a re-deposited seasoning layer on at least one sidewall of said dielectric layer;
a conductive seed layer on said first and second dielectric surfaces of said dielectric layer and aligned with said first surface of said first conductive interconnect, said conductive seed layer on the re-deposited seasoning layer, in which the re-deposited seasoning layer is surrounded by portions of the dielectric layer and said conductive seed layer; and
a second conductive interconnect on said conductive seed layer, aligned with said first and second dielectric surfaces of said dielectric layer and aligned with said first surface of said first conductive interconnect.

10. The integrated circuit of claim 9 further comprising a titanium-containing layer on said dielectric layer and aligned with said first surface of said first conductive interconnect, wherein said conductive seed layer is further directly on said titanium-containing layer.

11. The integrated circuit of claim 9, wherein said insulating layer comprises a nitride.

12. The integrated circuit of claim 9, wherein said insulating layer comprises an oxide.

13. The integrated circuit of claim 9, wherein said insulating layer has a thickness between 7,000 and 20,000 Angstroms.

14. The integrated circuit of claim 9, wherein said conductive seed layer has a thickness between 500 and 8,000 Angstroms.

15. The integrated circuit of claim 9, wherein said second conductive interconnect further comprises nickel.

16. An integrated circuit comprising:
a semiconductor substrate;
an active device having a portion in said semiconductor substrate;
an insulating layer on said semiconductor substrate;
a conductive interconnect on said insulating layer;
a dielectric layer on said insulating layer, on a first surface of said conductive interconnect and on a sidewall of said conductive interconnect, wherein said dielectric layer comprises a first portion, with a first dielectric surface, directly on said first surface of said conductive interconnect, and a second portion, with a second dielectric surface, directly on said insulating layer but not over said first surface of said conductive interconnect, wherein said second dielectric surface of said second portion is at a first level lower than a second level, at which said first dielectric surface of said first portion is positioned, and lower than a third level, at which said first surface of said conductive interconnect is positioned;
a re-deposited seasoning layer on at least one sidewall of said dielectric layer;
a barrier conductive layer aligned with said first and second dielectric surfaces of said dielectric layer and aligned with said first surface of said conductive interconnect, said barrier conductive layer on the re-deposited seasoning layer, in which the re-deposited seasoning layer is surrounded by portions of the dielectric layer and said barrier conductive layer;
a conductive seed layer on said barrier conductive layer, aligned with said first and second dielectric surfaces of said dielectric layer and aligned with said first surface of said conductive interconnect; and
a solder interconnect on said conductive seed layer, aligned with said first and second dielectric surfaces of said dielectric layer and aligned with said first surface of said conductive interconnect.

17. The integrated circuit of claim 16, wherein said barrier conductive layer comprises titanium.

18. The integrated circuit of claim 16, wherein said insulating layer comprises a nitride.

19. The integrated circuit of claim 16, wherein said insulating layer comprises an oxide.

20. The integrated circuit of claim 16, wherein said insulating layer has a thickness between 7,000 and 20,000 Angstroms.

21. The integrated circuit of claim 16, wherein said conductive seed layer has a thickness between 500 and 8,000 Angstroms.

22. The integrated circuit of claim 16, wherein said barrier conductive layer has a thickness between 50 and 5,000 Angstroms.

23. An integrated circuit comprising:
a semiconductor substrate;
an active device having a portion in said semiconductor substrate;
an insulating layer on said semiconductor substrate;
a first conductive interconnect on said insulating layer;
a second conductive interconnect on said insulating layer;
a dielectric layer on said insulating layer, on a first surface and at least one sidewall of said first conductive interconnect, and on a first surface and at least one sidewall of said second conductive interconnect;
a re-deposited seasoning layer on at least one sidewall of said dielectric layer;
a conductive seed layer on said dielectric layer and aligned with said first surfaces of said first and second conductive interconnects, said conductive seed layer on the re-deposited seasoning layer, in which the re-deposited seasoning layer is surrounded by portions of the dielectric layer and said conductive seed layer; and
a third conductive interconnect on said conductive seed layer and aligned with said first surfaces of said first and second conductive interconnects.

24. The integrated circuit of claim 23 further comprising a titanium-containing layer on said dielectric layer and aligned with said first surfaces of said first and second conductive interconnects, wherein said conductive seed layer is further directly on said titanium-containing layer.

25. The integrated circuit of claim 23, wherein said insulating layer comprises a nitride.

26. The integrated circuit of claim 23, wherein said insulating layer comprises an oxide.

27. The integrated circuit of claim 23, wherein said third conductive interconnect further comprises nickel.

* * * * *